(12) United States Patent
Wu et al.

(10) Patent No.: US 11,576,257 B2
(45) Date of Patent: Feb. 7, 2023

(54) CIRCUIT BOARD

(71) Applicants: Avary Holding (Shenzhen) Co., Limited., Shenzhen (CN); QING DING PRECISION ELECTRONICS (HUAIAN) CO., LTD, Huai an (CN); GARUDA TECHNOLOGY CO., LTD., New Taipei (TW)

(72) Inventors: Wei-Liang Wu, Shenzhen (CN); Jia-He Li, Shenzhen (CN)

(73) Assignees: Avary Holding (Shenzhen) Co., Limited., Shenzhen (CN); QING DING PRECISION ELECTRONICS (HUAIAN) CO., LTD, Huai an (CN); GARUDA TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 17/748,300

(22) Filed: May 19, 2022

(65) Prior Publication Data

US 2022/0279647 A1 Sep. 1, 2022

Related U.S. Application Data

(62) Division of application No. 17/125,526, filed on Dec. 17, 2020, now Pat. No. 11,399,430.

(30) Foreign Application Priority Data

Nov. 27, 2020 (CN) .......................... 202011365023.4

(51) Int. Cl.
*H05K 1/02* (2006.01)
*G02B 6/36* (2006.01)
*H05K 1/11* (2006.01)
*H05K 1/18* (2006.01)
*H05K 3/34* (2006.01)
*H05K 3/46* (2006.01)

(52) U.S. Cl.
CPC ......... *H05K 1/0298* (2013.01); *G02B 6/3684* (2013.01); *H05K 1/0203* (2013.01); *H05K 1/0274* (2013.01); *H05K 1/115* (2013.01); *H05K 1/188* (2013.01); *H05K 3/341* (2013.01); *H05K 3/4697* (2013.01); *H05K 2201/09509* (2013.01); *Y10T 29/49171* (2015.01); *Y10T 29/5317* (2015.01)

(58) Field of Classification Search
CPC .... G02B 26/0841; G02B 6/3518; G02B 6/43; B01L 2300/0654; H05K 1/0251; H05K 2201/09845; H05K 3/429; Y10T 29/49826; Y10T 29/49165; Y10T 29/49171; Y10T 29/5317; F21V 7/04
USPC ......... 29/738, 825, 829, 832, 836, 855, 729, 29/739
See application file for complete search history.

(56) References Cited

U.S. PATENT DOCUMENTS

| | | | | |
|---|---|---|---|---|
| 10,288,823 B2 * | 5/2019 | Tsujita | ................. | H05K 1/0274 |
| 11,022,768 B2 * | 6/2021 | Konegawa | ........... | G02B 6/4214 |
| 2017/0329079 A1 | 11/2017 | Tsujita et al. | | |

* cited by examiner

*Primary Examiner* — Thiem D Phan
(74) *Attorney, Agent, or Firm* — ScienBiziP, P.C.

(57) ABSTRACT

A circuit board includes a substrate, a first inner circuit layer, a second inner circuit layer, a first insulating layer, a first optical fiber extending along a first direction, an optical component, an electrical component, a transparent insulating layer, a first inclined surface, a first reflective layer, a second inclined surface, a second reflective layer, and a second optical fiber extending along a second direction.

10 Claims, 4 Drawing Sheets

CIRCUIT BOARD

CROSS-REFERENCE TO RELATED APPLICATIONS

This is a divisional application of patent application Ser. No. 17/125,526 filed on Dec. 17, 2020, which is based on and claims priority to China Patent Application No. 202011365023.4 filed on Nov. 27, 2020, the contents of which are incorporated by reference herein.

FIELD

The subject matter herein generally relates to circuit boards, and more particularly to a method for manufacturing a circuit board and a circuit board.

BACKGROUND

Photoelectric hybrid circuit boards are used in optical communication technology. However, most of the electronic components are arranged on a surface of the circuit board, which is not conducive to miniaturization of the circuit board.

BRIEF DESCRIPTION OF THE DRAWINGS

Implementations of the present disclosure will now be described, by way of embodiments, with reference to the attached figures.

DETAILED DESCRIPTION

Figure 1:
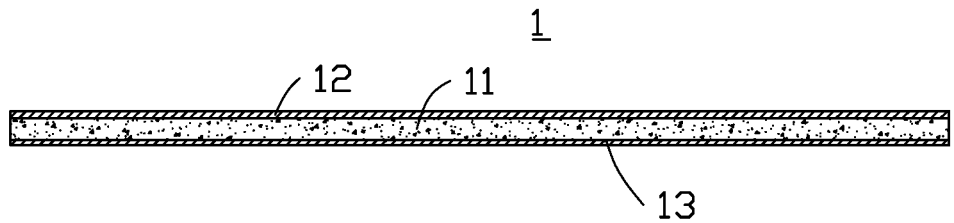
FIGS. 1 to 9 show an embodiment of a method for manufacturing a circuit board at respective steps.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or another word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

FIGS. 1-9 show an embodiment of a method for manufacturing a circuit board.

In a first step, referring to FIG. 1, a double-sided copper clad laminate 1 is provided. The double-sided copper clad laminate 1 includes a substrate 11, and a first copper foil layer 12 and a second copper foil layer 13 are respectively arranged on two opposite surfaces of the substrate 11.

In one embodiment, the substrate 11 may be, but is not limited to, an insulating material such as polypropylene (PP), polyimide (PI), and polyethylene terephthalate (PET).

Figure 2:
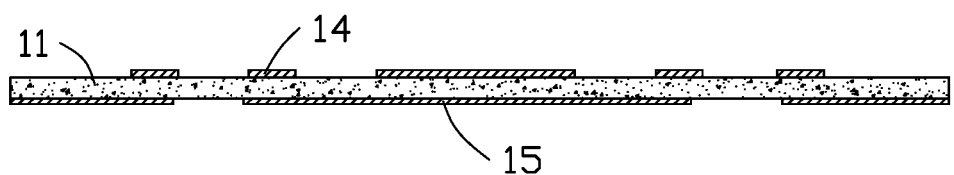

In a second step, referring to FIG. 2, a first inner circuit layer 14 and a second inner circuit layer 15 are respectively fabricated from the first copper foil layer 12 and the second copper foil layer 13.

In one embodiment, the first inner circuit layer 14 and the second inner circuit layer 15 are both made by a subtractive process. Specifically, the subtractive process may include steps of laminating, exposing, developing, etching, and film removing.

Figure 8:
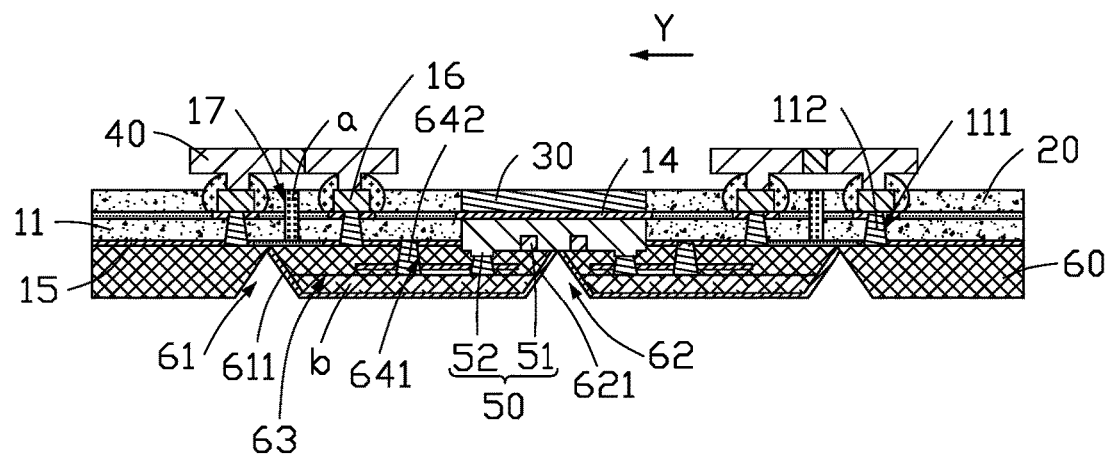

In one embodiment, referring to FIG. 8, a first conductive blind hole 111 is formed in the first inner circuit layer 14 and the substrate 11, and a first conductive pillar 112 electrically couples the first inner circuit layer 14 to the second inner circuit layer 15.

The first conductive blind hole 111 may be formed by mechanical drilling or image transferring, and the first conductive pillar 112 may be formed by electroplating or filling with a conductive material.

Figure 3:
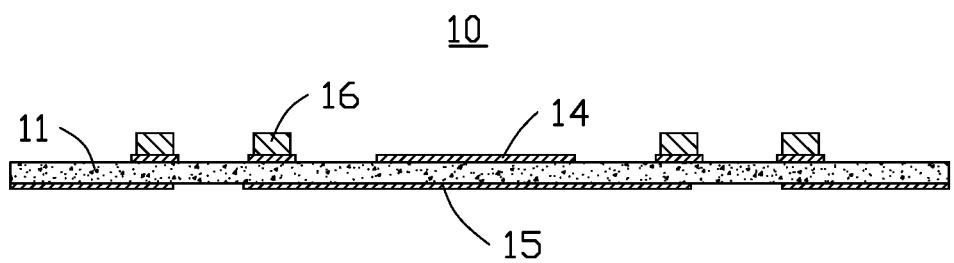

In a third step, referring to FIG. 3, a plurality of solder pads 16 is formed on the first inner circuit layer 14 to obtain a circuit substrate 10.

In one embodiment, the solder pads 16 can be obtained through a modified semi-additive process (mSAP). Specifically, a photosensitive insulating layer is formed on a surface of the first inner circuit layer 14, a patterned groove is obtained by exposure and development, a plurality of conductive bumps is formed in the groove by electroplating, and a gold metal layer is formed on the plurality of conductive bumps by electroless plating or electroplating to obtain the solder pads 16.

Figure 4:
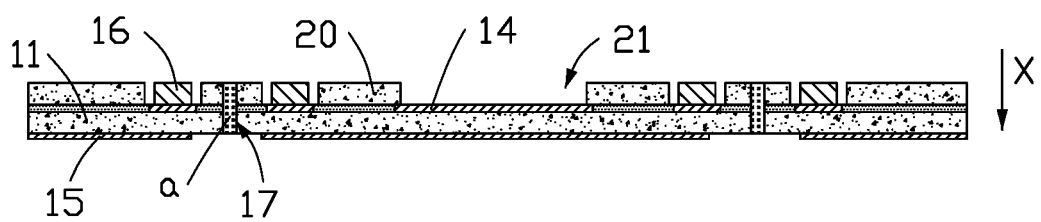

In a fourth step, referring to FIG. 4, a first insulating layer 20 is formed on a surface of the first inner circuit layer 14 and an area of the substrate 11 outside of the first inner circuit layer 14, and a surface of the solder pads 16 away from the first inner circuit layer 14 is not covered by the first insulating layer 20.

In one embodiment, the first insulating layer 20 can be pressed together with the circuit substrate 10 through a glue layer (not shown).

In one embodiment, an area of the first insulating layer 20 corresponding to the solder pad 16 is removed by etching, so that the solder pad 16 is not covered by the first insulating layer 20.

In one embodiment, the first insulating layer 20 may be, but is not limited to, insulating materials such as polypropylene (PP), polyimide (PI), and polyethylene terephthalate (PET).

In a fifth step, referring to FIG. 4 again, at least one first opening 17 is defined in the first insulating layer 20. The first opening 17 penetrates the circuit substrate 10 along a first direction X, and the first opening 17 is located between two adjacent solder pads 16. A first optical fiber is arranged in the first opening 17, and two ends of the first optical fiber are respectively arranged at two ends of the first opening 17.

In one embodiment, the first direction X is perpendicular to an extending direction of the circuit substrate 10.

In one embodiment, the first opening 17 is defined by laser etching.

In one embodiment, a plurality of the first openings 17 is defined, and the plurality of first openings 17 substantially enclose a rectangular structure.

Figure 5:
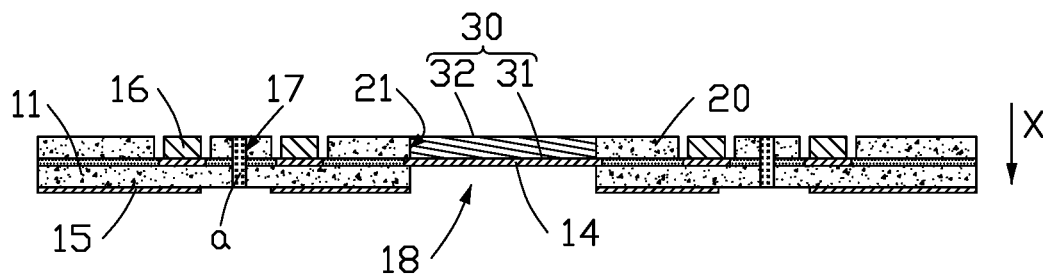

In a sixth step, referring to FIGS. 4 and 5, a third opening 21 is defined in the first insulating layer 20, so that an area of the first inner circuit layer 14 corresponding to the third opening 21 is uncovered. A heat dissipation block 30 is formed in the third opening 21. The heat dissipation block 30 includes a first heat dissipation surface 31 and a second heat dissipation surface 32. The first heat dissipation surface 31 and the second heat dissipation surface 32 are opposite surfaces of the heat dissipation block 30, respectively. The first heat dissipation surface 31 is in contact with the first inner circuit layer 14, and the second heat dissipation surface 32 faces out of the third opening 21. The second heat dissipation surface 32 facing out of the third opening 21 can improve a heat dissipation efficiency and improve a heat dissipation effect of the circuit board 100.

In one embodiment, the third opening 21 is substantially located in a middle of the rectangular structure enclosed by the plurality of first openings 17.

In one embodiment, the third opening 21 may be defined by laser etching.

In one embodiment, a material of the heat dissipation block 30 may be copper or other metals.

In one embodiment, the heat dissipation block 30 may be formed by electroplating in the third opening 21.

In a seventh step, referring to FIG. 5, a second opening 18 is defined in the second inner circuit layer 15. The second opening 18 penetrates the substrate 11 along the first direction X, and a position of the second opening 18 corresponds to the third opening 21.

In one embodiment, the second opening 18 is defined by laser etching.

In one embodiment, a size of the second opening 18 is substantially equal to a size of the third opening 21.

In other embodiments, the fifth, sixth, and seventh steps to define the three openings may be performed in no particular order.

Figure 6:
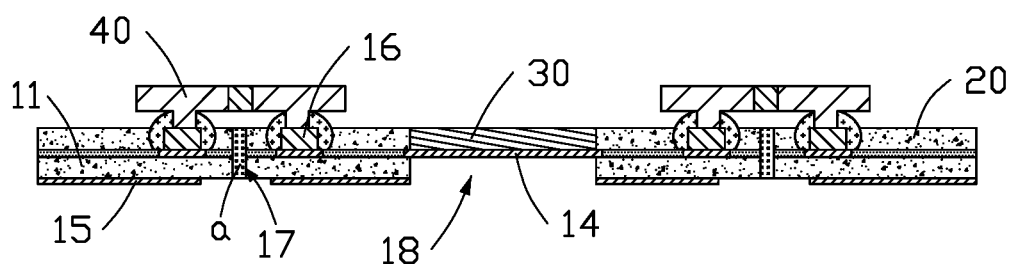

In an eighth step, referring to FIG. 6, at least one optical component 40 is provided. The optical component 40 is arranged on corresponding solder pads 16 and electrically coupled to the first inner circuit layer 14 through the corresponding solder pads 16. Each optical component 40 is arranged corresponding to one of the first openings 17, and the corresponding first optical fiber a located in the first opening 17 is used to receive signals of the optical component 40.

In one embodiment, the optical component 40 may be a light emitting element, a light receiving element, a specific wavelength light receiving and emitting element, or other optical components.

In one embodiment, the optical component 40 is soldered onto the corresponding solder pads 16 by a solder paste.

In one embodiment, there are a plurality of optical components 40, and each optical component 40 corresponds to one first optical fiber a.

Figure 7:
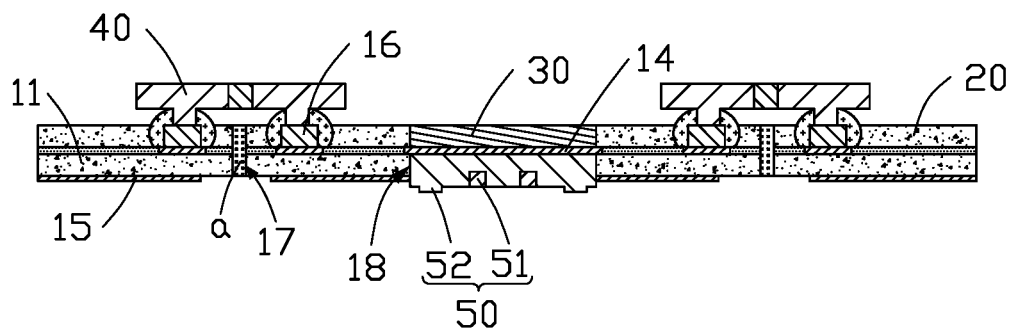

In a ninth step, referring to FIG. 7, an electronic component 50 is provided in the second opening 18, and the electronic component 50 is electrically coupled to the second inner circuit layer 15.

In one embodiment, the electronic component 50 includes a light receiving terminal 51 and a power connection terminal 52. Specifically, the electronic component 50 is a processor chip. The processor chip receives optical signals through the light receiving terminal 51, and then processes the optical signals and outputs a processing result through the power connection terminal 52.

In one embodiment, a side of the electronic component 50 adjacent to the first inner circuit layer 14 is in contact with the first inner circuit layer 14. The heat dissipation block 30 can effectively dissipate a large amount of heat generated by the electronic component 50 in time to improve operation of the electronic component 50.

In a tenth step, referring to FIG. 8, a transparent insulating layer 60 is formed on a surface of the second inner circuit layer 15, and the transparent insulating layer 60 covers the electronic component 50.

In one embodiment, the transparent insulating layer 60 is pressed onto a surface of the second inner circuit layer 15 and the electronic component 50 through a glue layer.

In one embodiment, the transparent insulating layer 60 is made of a transparent plastic material. Specifically, the material of the transparent insulating layer 60 may be thermoplastic polyimide (TPI), polyethylene terephthalate (PET), polyethylene naphthalate (PEN), or the like.

In an eleventh step, referring to FIG. 8, a first blind hole 61, a second blind hole 62, and a groove 63 are defined in the transparent insulating layer 60. The first blind hole 61 is located corresponding to the optical component 40, the second blind hole 62 is located corresponding to the electronic component 50, and the groove 63 is located between the first blind hole 61 and the second blind hole 62. An inner wall of the first blind hole 61 includes a first inclined surface 611, and an inner wall of the second blind hole 62 includes a second inclined surface 621. The groove 63 extends to the first inclined surface 611 and the second inclined surface 621. The first inclined surface 611 and a bottom surface of the groove 63 form an obtuse angle, and the second inclined surface 621 and a bottom surface of the groove 63 form an obtuse angle. The first inclined surface 611, the bottom surface of the groove 63, the second inclined surface 621, and the substrate 11 jointly enclose an inverted trapezoid structure.

In one embodiment, the first blind hole 61 and the second blind hole 62 are both tapered blind holes or trapezoidal blind holes.

In one embodiment, a third inner circuit layer 64 is formed on the bottom surface of the groove 63. The third inner circuit layer 64 is electrically coupled to the second inner circuit layer 15 and the power connection terminal 52 of the electronic component 50.

In one embodiment, a second conductive blind hole 641 is formed in the third inner circuit layer 64 and the transparent insulating layer 60, and the second conductive blind hole 641 electrically couples the third inner circuit layer 64 to the second inner circuit layer 15. The second conductive blind hole 641 may be formed by mechanical drilling or image transferring, and the second conductive pillar 642 may be formed by electroplating or filling with conductive material.

In a twelfth step, referring to FIG. 8 again, a second optical fiber b is arranged in the groove 63 along a second direction Y. One end of the second optical fiber b is located corresponding to the first optical fiber a, and another end of the second optical fiber b is located corresponding to the light receiving terminal 51 of the electronic component 50. The first optical fiber a and the second optical fiber b realize optical transmission between the optical component 40 and the electronic component 50.

In one embodiment, the second direction Y is the extending direction of the circuit substrate 10.

Figure 11:
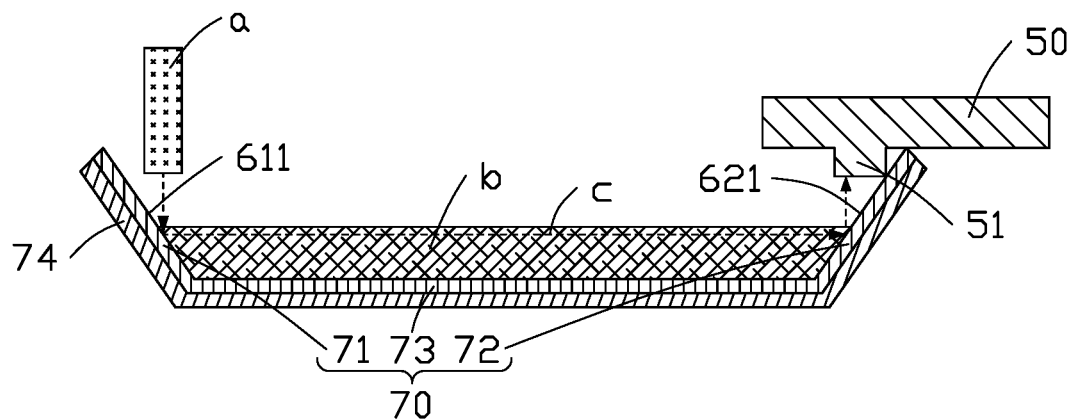
FIG. 11 is a schematic structural diagram of an optical channel of the circuit board.

In a thirteenth step, referring to FIG. 8 and FIG. 11, a reflective layer 70 is formed on the first inclined surface 611 and the second inclined surface 621. The reflective layer 70 is located on a side of the second optical fiber b away from the electronic component 50. The reflective layer 70 includes a first reflective layer 71 located on the first inclined surface 611, a second reflective layer 72 located on the second inclined surface 621, and a third reflective layer located on the side of the second optical fiber b away from the electronic component 50. The first optical fiber a, the first reflective layer 71, the second optical fiber b, and the second reflective layer 72 cooperatively form an optical channel c.

In one embodiment, the third reflective layer 73 extends to the first inclined surface 611 and the second inclined surface 621 to form the first reflective layer 71 and the second reflective layer 72.

Specifically, the optical component 40 transmits the optical signal into the first optical fiber a. The first optical fiber a transmits the optical signal to the first reflective layer 71. The first reflective layer 71 reflects the optical signal into the second optical fiber b. The second optical fiber b transmits the optical signal to the second reflective layer 72. The second reflective layer 72 reflects the optical signal to the light receiving terminal 51 of the electronic component 50. The electronic component 50 processes the optical signal to obtain an electrical signal, and the electrical signal is transmitted through the power connection terminal 52.

In other embodiments, when multiple optical components 40 are required for signal transmission with an electronic component, tapered blind holes or trapezoidal blind holes are defined, and each side wall of the blind holes are provided with a reflective layer. The reflective layers can reflect multiple optical signals from different directions to realize signal turning.

In one embodiment, a material of the reflective layer 70 may be metal with high reflectivity such as silver.

In a fourteenth step, referring to FIG. 8 and FIG. 11 again, a shielding layer 74 is formed on a side of the reflective layer 70 away from the second optical fiber b.

In one embodiment, a material of the shielding layer 74 may be a metal with shielding properties such as copper or a non-metal. The shielding layer 74 can be formed on the surface of the reflective layer 70 by electroplating. The shielding layer 74 can block signals outside the optical channel c (such as electrical signals of the circuit layers) from transmitting into the optical channel c, which improves a signal transmission efficiency of the circuit board and reduces signal loss. In addition, the third reflective layer 73 and the shielding layer 74 provided corresponding to the second optical fiber b can increase a rigidity of the second optical fiber b and improve a quality of light transmission.

Figure 9:
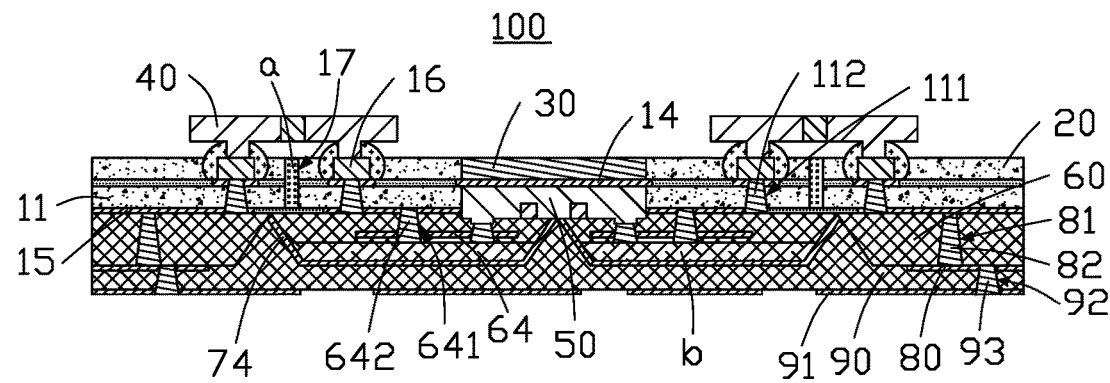

In a fifteenth step, referring to FIG. 9, a fourth inner circuit layer 80 is formed on the transparent insulating layer 60. The fourth inner circuit layer 80 is electrically coupled to the second inner circuit layer 15.

In one embodiment, a third conductive blind hole 81 is formed in the fourth inner circuit layer 80 and the transparent insulating layer 60, and a third conductive pillar 82 electrically couples the fourth inner circuit layer 80 to the second inner circuit layer 15.

The third conductive blind hole 81 may be formed by mechanical drilling or image transferring, and the third conductive pillar 82 may be formed by electroplating or filling with conductive material.

In a sixteenth step, referring to FIG. 9 again, a second insulating layer 90 is formed on a surface of the fourth inner circuit layer 80, the shielding layer 74, and an uncovered surface of the transparent insulating layer 60, and an outer circuit layer 91 is formed on a side of the second insulating layer 90 away from the transparent insulating layer 60. The outer circuit layer 91 is electrically coupled to the fourth inner circuit layer 80 to obtain the circuit board 100.

In this embodiment, a fourth conductive blind hole 92 is formed in the outer circuit layer 91 and the second insulating layer 90, and a fourth conductive pillar 93 electrically couples the outer circuit layer 91 to the fourth inner circuit layer 80. The fourth conductive blind hole 92 may be formed by mechanical drilling or image transferring, and the fourth conductive pillar 93 may be formed by electroplating or filling with conductive material.

In one embodiment, the second insulating layer 90 may be, but is not limited to, insulating materials such as polypropylene (PP), polyimide (PI), and polyethylene terephthalate (PET).

In other embodiments, additional inner circuit layers can be added between the fourth inner circuit layer 80 and the outer circuit layer 91 according to actual needs.

The method for manufacturing a circuit board provided by the present disclosure embeds the electronic component 50 into the circuit board 100, which is beneficial for achieving a lighter, thinner, shorter, and smaller circuit board 100. By arranging the heat dissipation block 30 on a surface of the electronic component 50, heat generated by the electronic component 50 can be effectively dissipated to improve a heat dissipation effect of the circuit board 100. By providing multiple optical channels c inside the circuit board 100, the optical signal transmission between the optical component 40 and the electronic component 50 can be realized. The shielding layer 74 is formed on the outer side of the optical channel c, which can block interference of external signals from transmitting into the optical channel c and improve a signal transmission efficiency of the circuit board 100 and reduce signal loss.

Figure 10:
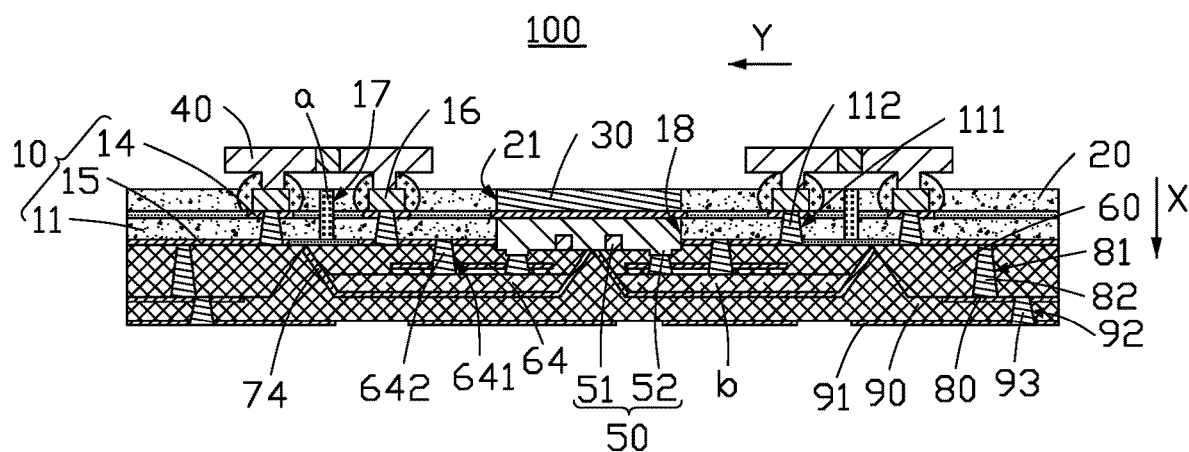
FIG. 10 is a schematic structural diagram of an embodiment of a circuit board.

Referring to FIGS. 10 and 11, the present disclosure provides a circuit board 100 prepared by the above-mentioned method. The circuit board 100 includes a circuit substrate 10. The circuit substrate 10 includes a substrate 11, and a first inner circuit layer 14 and a second inner circuit layer 15 are respectively arranged on opposite sides of the substrate 11.

The circuit board 100 further includes a first insulating layer 20 arranged on the first inner circuit layer 14, a first opening 17 defined in the first insulating layer 20 and penetrating the circuit substrate 10, a first optical fiber a arranged in the first opening 17 and extending along a first direction X, an optical component 40 arranged on the first insulating layer 20 and electrically coupled to the first inner circuit layer 14, a second opening 18 defined in the second inner circuit layer 15 and penetrating the substrate 11, an electrical component 50 arranged in the second opening 18 and electrically coupled to the second inner circuit layer 15, a transparent insulating layer 60 arranged on a surface of the second inner circuit layer 15 and the electronic component 50, a first inclined surface 611 formed on the transparent insulating layer 60 and corresponding to the optical component 40, a first reflective layer 71 arranged on the first inclined surface 611, a second inclined surface 621 formed on the transparent insulating layer 60 and corresponding to the electronic component 50, a second reflective layer 72 arranged on the second inclined surface 621, a groove 63 defined in the transparent insulating layer 60 and extending to the first inclined surface 611 and the second inclined surface 621, and a second optical fiber b arranged in the groove 63 and extending along the second direction Y.

The first optical fiber a, the first reflective layer 71, the second optical fiber b, and the second reflective layer 72 cooperatively form an optical channel c. The optical channel c is used for realizing optical signal transmission between the optical component 40 and the electronic component 50.

Specifically, the optical component 40 transmits the optical signal into the first optical fiber a. The first optical fiber a transmits the optical signal to the first reflective layer 71. The first reflective layer 71 reflects the optical signal into the second optical fiber b. The second optical fiber b transmits the optical signal to the second reflective layer 72. The second reflective layer 72 reflects the optical signal to the light receiving terminal 51 of the electronic component 50. The electronic component 50 processes the optical signal to obtain an electrical signal, and the electrical signal is transmitted through the power connection terminal 52. In one embodiment, a side of the first reflective layer 71, the second reflective layer 72, and the second optical fiber b away from the electronic component 50 are provided with a shielding layer 74. The shielding layer 74 is used for shielding interference from signals outside the optical channel c, thereby ensuring the transmission efficiency of the optical signals and reducing transmission loss of the optical signals.

In one embodiment, the circuit substrate 10 further includes a plurality of solder pads 16 arranged on the first inner circuit layer 14. The solder pads 16 penetrate the first insulating layer 20 and are electrically coupled to the optical component 40.

In one embodiment, the electronic component 50 includes a light receiving terminal 51 and a power connection terminal 52. Specifically, the electronic component 50 is a processor chip. The processor chip receives optical signals through the light receiving terminal 51, and then processes the optical signals and outputs a processing result through the power connection terminal 52.

In one embodiment, the circuit board 100 further includes a third opening 21 defined in the first insulating layer 20 and a heat dissipation block 30 arranged in the third opening 21. A side of the electronic component 50 adjacent to the first inner circuit layer 14 is in contact with the first inner circuit layer 14. The heat dissipation block 30 can effectively dissipate a large amount of heat generated by the electronic component 50 in time to improve operation of the electronic component 50.

In one embodiment, the transparent insulating layer 60 is made of a transparent plastic material. Specifically, the material of the transparent insulating layer 60 may be thermoplastic polyimide (TPI), polyethylene terephthalate (PET), polyethylene naphthalate (PEN), or the like.

In one embodiment, the first inclined surface 611 and a bottom surface of the groove 63 form an obtuse angle, and the second inclined surface 621 and a bottom surface of the groove 63 form an obtuse angle. The first inclined surface 611, the bottom surface of the groove 63, the second inclined surface 621, and the substrate 11 jointly enclose an inverted trapezoid structure.

In one embodiment, the circuit board 100 further includes a third inner circuit layer 64 between the second optical fiber b and the electronic component 50. The third inner circuit layer 64 is electrically coupled to the second inner circuit layer 15 and the power connection terminal 52 of the electronic component 50.

In one embodiment, a second conductive blind hole 641 is formed in the third inner circuit layer 64 and the transparent insulating layer 60, and a second conductive pillar 642 electrically couples the third inner circuit layer 64 and the second inner circuit layer 15. The second conductive blind hole 641 may be formed by mechanical drilling or image transferring, and the second conductive pillar 642 may be formed by electroplating or filling with conductive material.

In one embodiment, the circuit board 100 further includes a third reflective layer 73, and the third reflective layer 73 is arranged on a surface of the second optical fiber b away from the electronic component 50. Specifically, the third reflective layer 73 is located between the second optical fiber b and the shielding layer 74.

In one embodiment, the material of the reflective layer 70 may be a metal with high reflectivity such as silver.

In one embodiment, a material of the shielding layer 74 may be a metal with shielding properties such as copper or a non-metal. The shielding layer 74 can be formed on the surface of the reflective layer 70 by electroplating. The shielding layer 74 can block signals outside the optical channel c (such as electrical signals of the circuit layers) from transmitting into the optical channel c, which improves a signal transmission efficiency of the circuit board and reduces signal loss. In addition, the third reflective layer 73 and the shielding layer 74 provided corresponding to the second optical fiber b can increase a rigidity of the second optical fiber b and improve a quality of light transmission.

In one embodiment, the circuit board 100 further includes a second insulating layer 90 arranged on a surface of the transparent insulating layer 60 and the second optical fiber b and an outer circuit layer 91 arranged on a side of the second insulating layer 90 away from the transparent insulating layer 60 and electrically coupled to the second inner circuit layer 15.

In one embodiment, the circuit board 100 further includes a fourth inner circuit layer 80 formed before the transparent insulating layer 60 and the second insulating layer 90. The fourth inner circuit layer 80 is electrically coupled to the second inner circuit layer 15.

In one embodiment, a third conductive blind hole 81 is formed in the fourth inner circuit layer 80 and the transparent insulating layer 60, and a third conductive pillar 82 electrically couples the inner circuit layer 80 and the second inner circuit layer 15. The third conductive blind hole 81 may be formed by mechanical drilling or image transferring, and the third conductive pillar 82 may be formed by electroplating or filling with conductive material.

In one embodiment, a fourth conductive blind hole 92 is formed in the outer circuit layer 91 and the second insulating layer 90, and a fourth conductive pillar 93 electrically couples the outer circuit layer 91 to the fourth inner circuit layer 80. The fourth conductive blind hole 92 may be formed by mechanical drilling or image transferring, and the fourth conductive pillar 93 may be formed by electroplating or filling with conductive material.

In this embodiment, the second insulating layer 90 may be, but is not limited to, insulating materials such as polypropylene (PP), polyimide (PI), or polyethylene terephthalate (PET).

Figure 12:
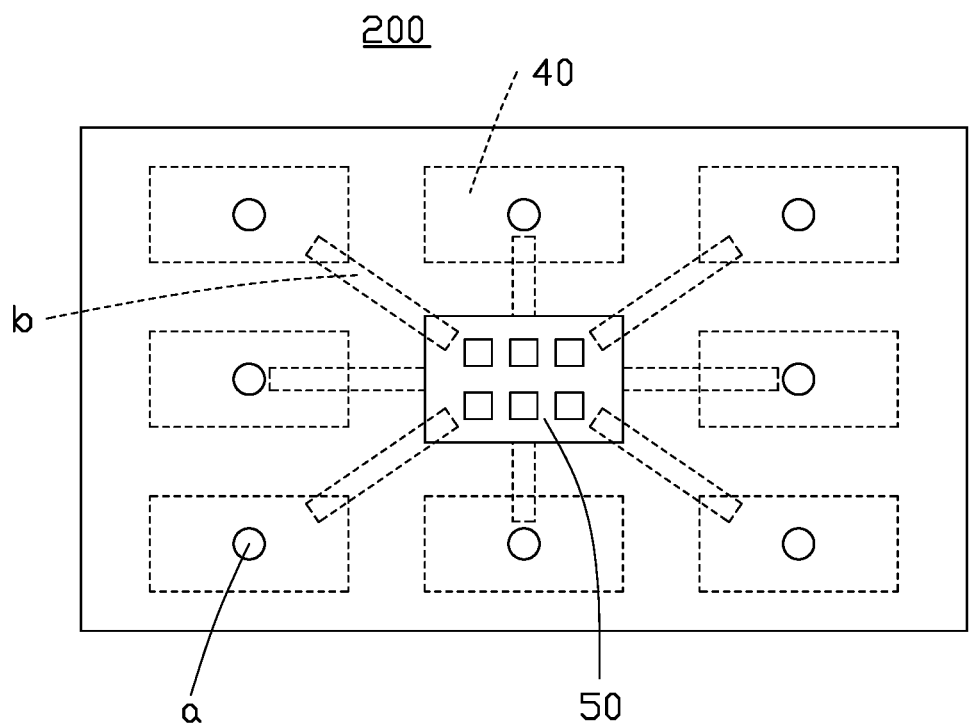
FIG. 12 is a schematic structural diagram of another embodiment of a circuit board.

Referring to FIG. 12, in another embodiment, a circuit board 200 includes an electronic component 50 and eight optical components 40 arranged around the electronic component 50. Each of the optical components 40 achieves optical signal transmission with the electronic component 50 through a respective first optical fiber a and a respective second optical fiber b. Each first optical fiber a is arranged perpendicularly to the corresponding second optical fiber b.

In the circuit board 100 provided by the present disclosure, the electronic component 50 is embedded in the circuit board 100, and the optical channel c for transmitting optical signals is embedded in the circuit board 100 to realize the optical signal transmission between the optical component 40 and the electronic component 50, which is beneficial for achieving a lighter, thinner, shorter, and smaller circuit board 100. By arranging the heat dissipation block 30 on a surface of the electronic component 50, heat generated by the electronic component 50 can be effectively dissipated to improve a heat dissipation effect of the circuit board 100. The shielding layer 74 is formed on the outer side of the optical channel c, which can block interference of external signals from transmitting into the optical channel c and improve a signal transmission efficiency of the circuit board 100 and reduce signal loss.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A circuit board comprising:
   a circuit substrate comprising a substrate, a first inner circuit layer, and a second inner circuit layer, the first inner circuit layer and the second inner circuit layer being respectively arranged on two opposite surfaces of the substrate;
   a first insulating layer arranged on the first inner circuit layer;
   a first opening defined in the first insulating layer and penetrating the circuit substrate;
   a first optical fiber arranged in the first opening and extending along a first direction;
   an optical component arranged on the first insulating layer and electrically coupled to the first inner circuit layer;
   a second opening defined in the second inner circuit layer and penetrating the substrate;
   an electrical component arranged in the second opening and electrically coupled to the second inner circuit layer;
   a transparent insulating layer arranged on a surface of the second inner circuit layer and the electronic component;
   a first inclined surface formed on the transparent insulating layer and corresponding to the optical component;
   a first reflective layer arranged on the first inclined surface;
   a second inclined surface formed on the transparent insulating layer and corresponding to the electronic component;
   a second reflective layer arranged on the second inclined surface;
   a groove defined in the transparent insulating layer and extending to the first inclined surface and the second inclined surface; and
   a second optical fiber arranged in the groove and extending along a second direction;
   wherein:
   the first optical fiber, the first reflective layer, the second optical fiber, and the second reflective layer cooperatively form an optical channel; and
   the optical channel is configured for realizing optical signal transmission between the optical component and the electronic component.

2. The circuit board of claim 1, further comprising a third opening and a heat dissipation block, wherein:
   the third opening penetrates the second inner circuit layer and the substrate;
   the heat dissipation block is provided in the third opening;
   the third opening is arranged corresponding to the second opening; and
   the heat dissipation block is in contact with the first inner circuit layer.

3. The circuit board of claim 2, further comprising a plurality of first openings defined in the first insulating layer and penetrating the circuit substrate and a plurality of first optical fibers arranged in the plurality of first openings respectively, wherein the plurality of first openings surrounds the third opening.

4. The circuit board of claim 1, wherein:
   a side of each of the first reflective layer, the second reflective layer, and the second optical fiber away from the electronic component is provided with a shielding layer.

5. The circuit board of claim 1, further comprising a second insulating layer and an outer circuit layer, wherein:
   the second insulating layer is arranged on a surface of the transparent insulating layer and the second optical fiber; and
   the outer circuit layer is arranged on a side of the second insulating layer away from the transparent insulating layer and electrically coupled to the second inner circuit layer.

6. The circuit board of claim 1, further comprising a plurality of solder pads arranged on the first inner circuit layer, wherein:
   the plurality of solder pads penetrates the first insulating layer and is electrically coupled to the optical component.

7. The circuit board of claim 1, further comprising a third inner circuit layer between the second optical fiber and the electronic component, wherein the third inner circuit layer is electrically coupled to the second inner circuit layer and the electronic component.

8. The circuit board of claim 1, further comprising a third reflective layer arranged on a surface of the second fiber away from the electronic component.

9. The circuit board of claim 1, further comprising a fourth inner circuit layer arranged on the transparent insulating layer, wherein the fourth inner circuit layer is electrically coupled to the second inner circuit layer.

10. The circuit board of claim 1, wherein the first inclined surface, a bottom surface of the groove, the second inclined surface, and a surface of the substrate are joined and define an inverted trapezoid structure.

* * * * *